(12) United States Patent
Wu et al.

(10) Patent No.: US 9,825,422 B2
(45) Date of Patent: Nov. 21, 2017

(54) OPTIC-MICROWAVE FREQUENCY DISCRIMINATOR FOR LASER FREQUENCY DIFFERENCE LOCKING, AND METHOD THEREOF

(71) Applicants: Zibo Qi-red PhotoElectrical Technology Co., Ltd, Zibo, Shandong (CN); Beijing Qi-red PhotoElectrical Technology Co., Ltd, Beijing (CN)

(72) Inventors: Shudong Wu, Beijing (CN); Wenbo Wang, Beijing (CN)

(73) Assignees: Zibo Qi-red PhotoElectrical Technology Co., Ltd., Zibo, Shandong (CN); Beijing Qi-red PhotoElectrical Technology Co., Ltd., Beijing (CN)

( * ) Notice: Subject to any disclaimer, the term of this patent is extended or adjusted under 35 U.S.C. 154(b) by 0 days.

(21) Appl. No.: 15/144,832

(22) Filed: May 3, 2016

(65) Prior Publication Data

US 2016/0248218 A1    Aug. 25, 2016

(30) Foreign Application Priority Data

Apr. 8, 2016   (CN) .......................... 2016 1 0218562

(51) Int. Cl.
    *H01S 3/13*     (2006.01)
    *H01S 5/0687*   (2006.01)

(52) U.S. Cl.
    CPC .......... *H01S 3/1304* (2013.01); *H01S 3/1305* (2013.01); *H01S 5/0687* (2013.01)

(58) Field of Classification Search
    CPC ..... H01S 3/1304; H01S 3/1305; H01S 5/0687
    See application file for complete search history.

(56) References Cited

U.S. PATENT DOCUMENTS

| 6,580,532 B1 * | 6/2003 | Yao ..................... H04B 10/2507 372/29.011 |
| 2005/0265406 A1 * | 12/2005 | Kaertner .................. G04G 7/02 372/30 |
| 2008/0018903 A1 * | 1/2008 | Bao ........................ G01K 11/32 356/477 |

* cited by examiner

*Primary Examiner* — Tod T Van Roy

(57) ABSTRACT

An optic-microwave frequency discriminator includes: a fiber coupler receives and combines a first laser and a second laser, than the fiber coupler respectively generates and outputs a first light signal and a second light signal; a photodiode module respectively receives the first light signal and the second light signal, and converts the first light signal into a first microwave signal and converts the second light signal into a second microwave signal; a microwave phase shifter generates a shifted microwave signal by introducing a phase shift to the second microwave signal; a 90° microwave bridge combines the first microwave signal and the shifted microwave signal for generating a first bridge signal and a second bridge signal; a normalized balanced detection module generates an error signal; and a control module generates a controlling voltage signal according to the error signal for tuning a frequency of the second laser.

3 Claims, 4 Drawing Sheets

OPTIC-MICROWAVE FREQUENCY DISCRIMINATOR FOR LASER FREQUENCY DIFFERENCE LOCKING, AND METHOD THEREOF

CROSS REFERENCE OF RELATED APPLICATION

The present invention claim claims priority under 35 U.S.C. 119(a-d) to CN 201610218562.2, filed Apr. 8, 2016.

BACKGROUND OF THE PRESENT INVENTION

Field of Invention

The present invention relates to frequency difference locking techniques, and more particularly to an optic-microwave frequency discriminator for laser frequency difference locking, and a method thereof.

Description of Related Arts

Precise frequency difference locking between two lasers are required in variety of applications such as distributed temperature/strain sensing based on Brilliouin scattering, photonic generation of high microwave frequencies. Recent years, DFB lasers with extreme narrow line width (a few KHz) are commercially available. However, the frequency difference between two independent free-running lasers are changing all the time and drifting in a range of a few ten MHz. The present invention is about a novel frequency difference locking technique.

A Brilliouin distributed sensor manufacture, OZ Optics, developed a proportional integral derivative (PID) controller for the frequency difference locking. A tunable fiber delay line is used for the frequency tuning. Fiber delay lines perform mechanical tuning, suffer from low-accuracy, low-speed and poor repeatability. Optical phase lock-loop is another approach for the control of frequency difference between two lasers. The technique requires expensive RF source and other RF components. Optical injection locking is a different technique for generating high quality microwave signals. It uses RF signal to modulate a master laser, then inject the high orders of the modulated spectra to lock two slave lasers. The technique, requiring RF source and a master laser, is complicated and very expensive. Microwave signal generation based on RF external modulation is based on use of higher orders of the modulation to generate higher microwave frequency. It requires only a single laser, but it still requires expensive RF source.

The present invention proposes a novel Optic-Microwave Frequency Discriminator (OMFD) to perform precise frequency difference locking between two lasers. The technique does not require any expensive RF sources. OMFD uses a microwave phase shifter for agile and accurate frequency tuning. It can adapt to different locking accuracy requirement and provides reliable, stable frequency locking and tuning.

SUMMARY OF THE PRESENT INVENTION

An object of the present invention is to provide closed phase lock loop for precise microwave frequency tuning and achieve a high microwave frequency resolution.

Accordingly, in order to accomplish the above object, the present invention provides an optic-microwave frequency discriminator for laser frequency difference locking, comprising:

a fiber coupler, wherein the fiber coupler receives and combines a first laser from a first laser device and a second laser from a second laser device, the fiber coupler respectively generates and outputs a first light signal and a second light signal, which are identical, through a first fiber coupler output terminal and a second fiber coupler output terminal;

a photodiode module respectively communicating with the first fiber coupler output terminal and the second fiber coupler output terminal, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal;

a microwave phase shifter communicating with the second photodiode output terminal, so as to receive the second microwave signal, generate a shifted microwave signal by introducing a phase shift to the second microwave signal, and output the shifted microwave signal;

a 90° microwave bridge comprising a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; the 90° microwave bridge combines the first microwave signal and the shifted microwave signal for generating a first bridge signal which is outputted through the first bridge output terminal, and generating a second bridge signal which is outputted through the second bridge output terminal;

a normalized balanced detection module, which respectively communicates with the first bridge output terminal and the second bridge output terminal for receiving the first bridge signal and the second bridge signal, wherein the normalized balanced detection module calculates the first bridge signal and the second bridge signal for generating and outputting an error signal; and a control module communicating with the normalized balanced detection module for receiving the error signal, wherein the control module generates a controlling voltage signal according to the error signal, and sends the controlling voltage to the second laser device for tuning a frequency of the second laser; the control module also sends the controlling voltage to the microwave phase shifter for adjusting the phase shift.

Preferably, the photodiode module comprises:

a first photodiode communicating with the first fiber coupler output terminal, so as to receive the first light signal, convert the first light signal into the first microwave signal, and output the first microwave signal through the first photodiode output terminal; and a second photodiode communicating with the second fiber coupler output terminal, so as to receive the second light signal, convert the second light signal into the second microwave signal, and output the second microwave signal through the second photodiode output terminal.

Preferably, after being converted by the photodiode module, frequencies of the first microwave signal and the second microwave signal equal to a frequency difference between the first laser and the second laser.

Preferably, a phase difference between the first bridge signal and the second bridge signal is calculated by:

$$\Phi(V) := 2\cdot\pi\cdot\frac{OPD}{c}\cdot fB + \theta(V)$$

wherein θ(V) is the phase shift introduced by the microwave phase shifter, OPD is an optical path difference between the first light signal and the second light signal, fB is a frequency difference between the first laser and the second laser, and c is a light speed in a fiber.

Preferably, the normalized balanced detection module generates the error signal according to:

$$U(V, fB) := \cos\left[\left(2\cdot\pi\cdot\frac{OPD}{c}\cdot fB\right) + \theta(V)\right]$$

Preferably, the normalized balanced detection module comprises a first microwave diode, a second microwave diode and a processor, wherein the first microwave diode communicates with the first bridge output terminal for receiving the first bridge signal and generates a C1 signal; the second microwave diode communicates with the second bridge output terminal for receiving the second bridge signal and generates a C2 signal; the processor respectively communicates with the first microwave diode and the second microwave diode, so as to process the C1 signal and the C2 signal with: (C1−C2)/(C1+C2).

The present invention also provides a method of an optic-microwave frequency discriminator for laser frequency difference locking, comprising steps of:

1) receiving and combining a first laser from a first laser device and a second laser from a second laser device with a fiber coupler, than respectively generating and outputting a first light signal and a second light signal, which are identical, through a first fiber coupler output terminal and a second fiber coupler output terminal;

2) respectively communicating with the first fiber coupler output terminal and the second fiber coupler output terminal with a photodiode module, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal;

3) communicating with the second photodiode output terminal with a microwave phase shifter, so as to receive the second microwave signal, generate a shifted microwave signal by introducing a phase shift to the second microwave signal, and output the shifted microwave signal;

4) using a 90° microwave bridge comprising a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; combining the first microwave signal and the shifted microwave signal with the 90° microwave bridge for generating a first bridge signal which is outputted through the first bridge output terminal, and generating a second bridge signal which is outputted through the second bridge output terminal;

5) respectively communicating with the first bridge output terminal and the second bridge output terminal with a normalized balanced detection module for receiving the first bridge signal and the second bridge signal, wherein the normalized balanced detection module calculates the first bridge signal and the second bridge signal for generating and outputting an error signal; and 6) communicating with the normalized balanced detection module with a control module for receiving the error signal, wherein the control module generates a controlling voltage signal according to the error signal, and sends the controlling voltage to the second laser device for tuning a frequency of the second laser; the control module also sends the controlling voltage to the microwave phase shifter for adjusting the phase shift.

Compared with conventional techniques, the present invention has advantages as follows.

1. Large OPD makes an ultra-high frequency resolution possible (which is impossible for microwave).

2. The microwave phase shifter provides agile, accurate and stable interferometer tuning (which is very difficult for optics).

3. The microwave phase shifter forms a closed control loop for microwave frequency locking to ensure frequency stability and accuracy.

4. Normalized balanced detection can effectively suppress intensity noise from lasers and significantly improve signal to noise ratio.

5. The read-out point in the microwave phase shifter is always at the zero output point of the optic-microwave frequency discriminator, ensuring optimal detection sensitivity.

6. A frequency setting time is an addressing time in the microwave phase shifter. A tuning bandwidth of the microwave phase shifter is 2 GHz. Therefore, it mainly depends on available signal noise ratio.

7. A thermal coefficient of a single-mode optical fiber is around $10^{-6}/C.°$. If a fiber temperature is controlled within 0.1 C.°, for 10 GHz, for example, a 1 KHz microwave frequency resolution can be achieved These and other objectives, features, and advantages of the present invention will become apparent from the following detailed description, the accompanying drawings, and the appended claims.

DETAILED DESCRIPTION OF THE PREFERRED EMBODIMENT

Figure 1:
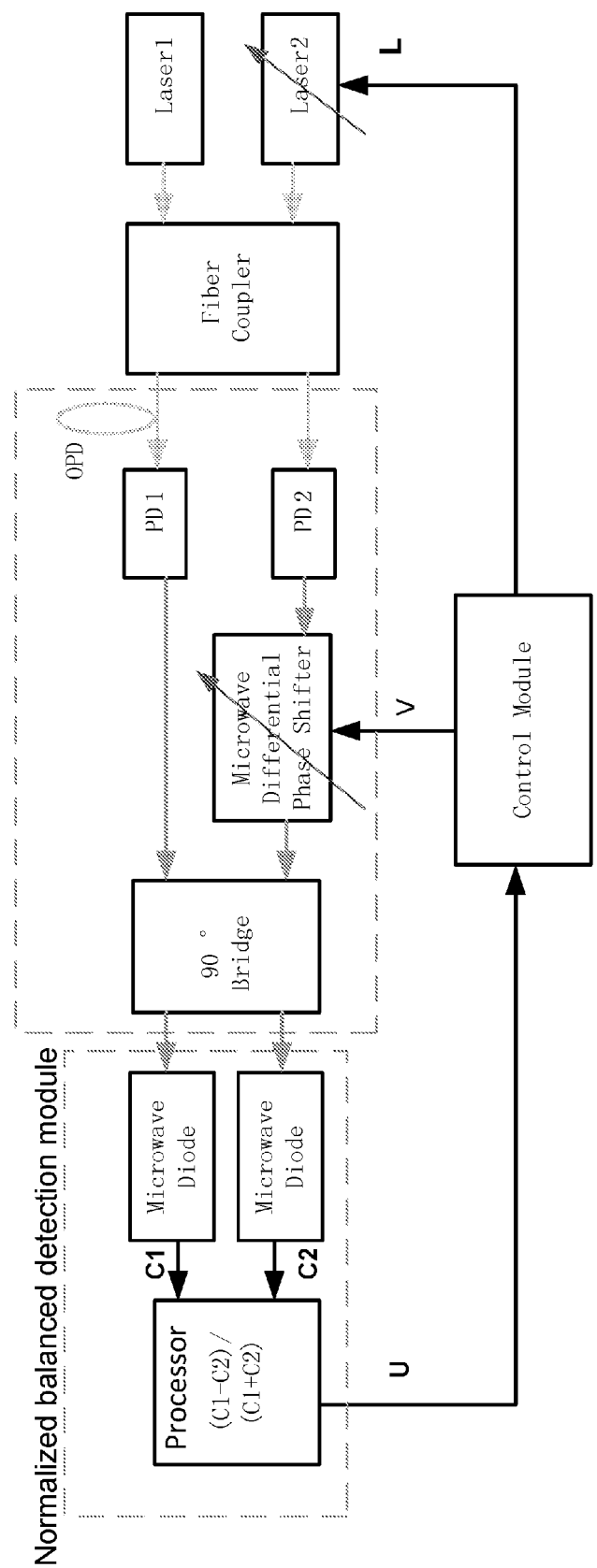
FIG. 1 is a schematic view of an optic-microwave frequency discriminator for laser frequency difference locking according to the present invention.

Referring to the drawings, the present invention is further illustrated.

Referring to FIG. 1, a fiber coupler combines two lasers and outputs two identical channels of mixed light from two lasers. According to the present invention, two high-speed photodiodes PD1 and PD2 convert the mixed light to two channels of microwave signals. A frequency of the microwave signal fB is a frequency difference of the two lasers. After passing a microwave phase shifter in one arm, two channels are combined by a 90° microwave bridge. In fact, 90° microwave bridge is similar to a Mach-Zehnda optic-microwave interferometer. Two output channels from the 90° microwave bridge are similar to two outputs of the interferometer. The phase difference between two channels is given by:

$$\Phi(V) := 2 \cdot \pi \cdot \frac{OPD}{c} \cdot fB + \theta(V)$$

wherein θ(V) is the phase shift introduced by the microwave phase shifter, OPD is an optical path difference between the first light signal and the second light signal, fB is a frequency difference between the first laser and the second laser, and c is a light speed in a fiber.

According to the present invention, normalized balanced detection technique is applied. C1 and C2 are outputted from the first and second microwave diodes. A generated error signal U(V) is expressed as:

$$U(V, fB) := \cos\left[\left(2 \cdot \pi \cdot \frac{OPD}{c} \cdot fB\right) + \theta(V)\right].$$

Figure 2:
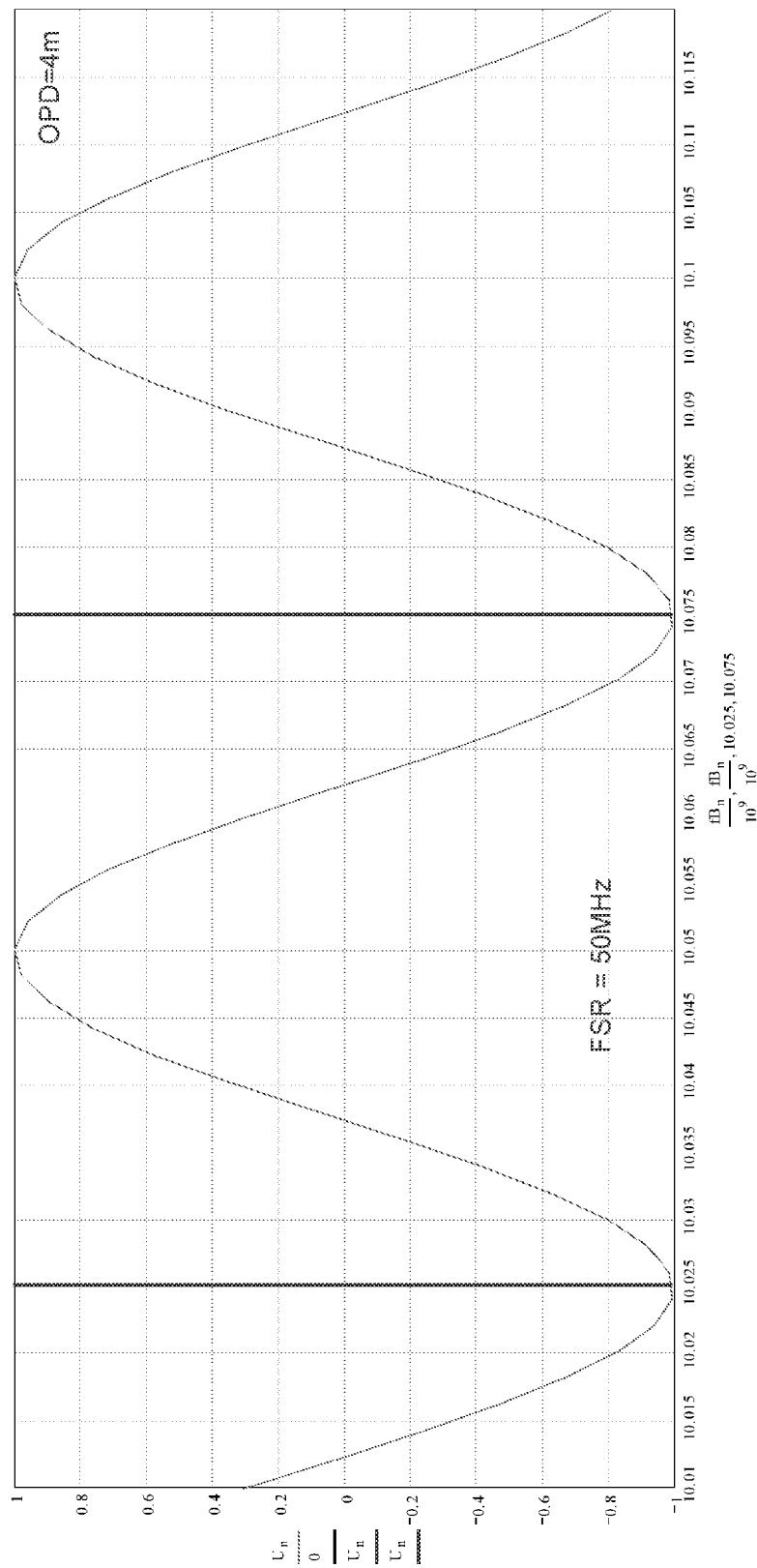
FIG. 2 illustrates a relation between an error signal and a frequency difference between a first laser and a second laser.

Referring to FIG. 2, U(V)=0 (at Φ(V)=90° is supposed as a frequency locking point. In terms of the microwave phase shifter, for any fB, the optic-microwave frequency discriminator outputs the error signal U. A controlling voltage signal V is generated from a control module and sent to tune a frequency of the laser 2. Through the closed loop control, the error signal U is minimized. At the locking point, θ(V) read on the microwave phase shifter represents the frequency difference, also the microwave frequency.

The optical path difference OPD between the two channels determines a free spectral range FSR, which is given by:

$$FSR := \frac{c}{OPD}.$$

If Δφ is a resolution of the microwave phase shifter, a total number of resolvable frequencies is 2π/Δφ, and the frequency resolution is given by:

$$\Delta fB := \left|\frac{\Delta\phi \cdot c}{2 \cdot \pi OPD}\right|.$$

In principle, by increasing a fiber length, which means increasing the OPD, we can achieve any frequency resolution. This is not possible for microwave cables.

Figure 3:
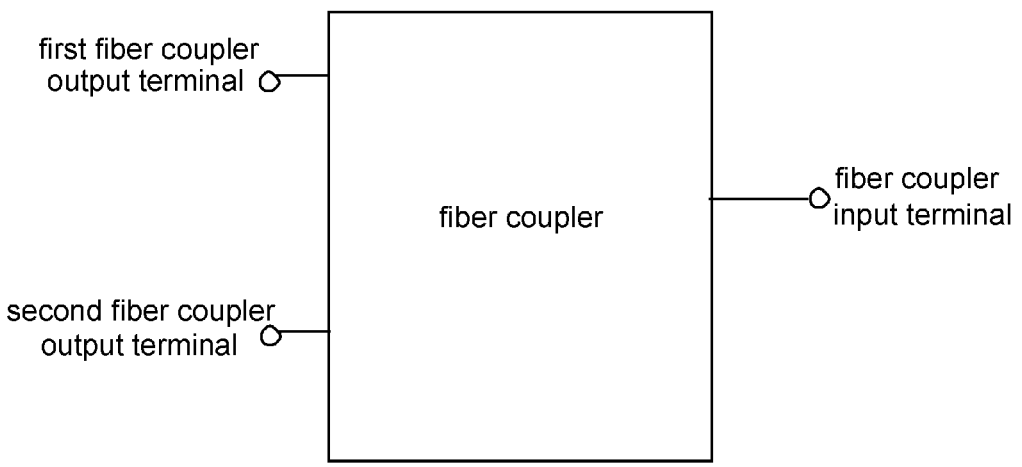
FIG. 3 is a sketch view of a fiber coupler according to the present invention.

Referring to FIG. 3, the fiber coupler receives and combines the first laser from a first laser device and the second laser from a second laser device, than the fiber coupler respectively generates and outputs a first light signal and a second light signal, which are identical, through a first fiber coupler output terminal and a second fiber coupler output terminal.

Figure 4:
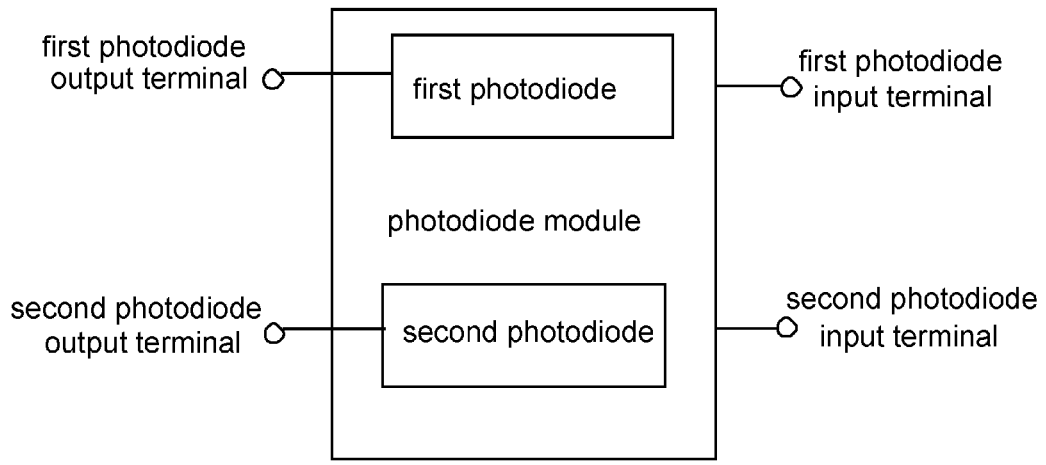
FIG. 4 is a sketch view of a photodiode module according to the present invention.

Referring the FIG. 4, a photodiode module respectively communicates with the first fiber coupler output terminal and the second fiber coupler output terminal, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal.

Preferably, the photodiode module comprises:

a first photodiode communicating with the first fiber coupler output terminal, so as to receive the first light signal, convert the first light signal into the first microwave signal, and output the first microwave signal through the first photodiode output terminal; and a second photodiode communicating with the second fiber coupler output terminal, so as to receive the second light signal, convert the second light signal into the second microwave signal, and output the second microwave signal through the second photodiode output terminal.

Figure 5:
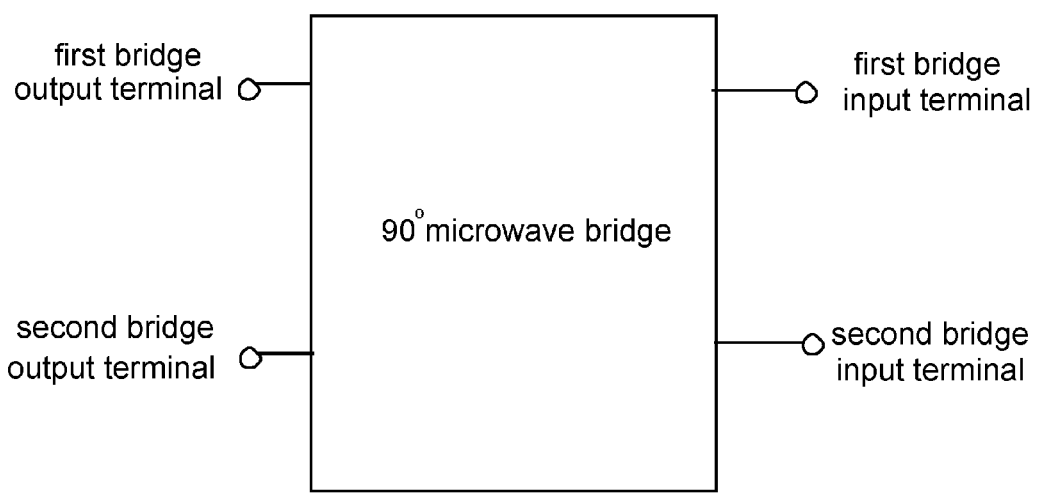
FIG. 5 is a sketch view of a 90° microwave bridge according to the present invention.

Referring to FIG. 5, the 90° microwave bridge comprises a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; the 90° microwave bridge combines the first microwave signal and the shifted microwave signal for generating a first bridge signal which is outputted through the first bridge output terminal, and generating a second bridge signal which is outputted through the second bridge output terminal.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An optic-microwave frequency discriminator for laser frequency difference locking, comprising:

a fiber coupler, wherein the fiber coupler receives and combines a first laser from a first laser device and a second laser from a second laser device, the fiber coupler respectively generates and outputs a first light signal and a second light signal, which are identical, through a first fiber coupler output terminal and a second fiber coupler output terminal;

a photodiode module respectively communicating with the first fiber coupler output terminal and the second fiber coupler output terminal, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal;

a microwave phase shifter communicating with the second photodiode output terminal, so as to receive the second microwave signal, generate a shifted microwave signal by introducing a phase shift to the second microwave signal, and output the shifted microwave signal;

a 90° microwave bridge comprising a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; the 90° microwave bridge combines the first microwave signal and the shifted microwave signal for generating a first bridge signal which is outputted through the first bridge output terminal, and generating a second bridge signal which is outputted through the second bridge output terminal;

a normalized balanced detection module, which respectively communicates with the first bridge output terminal and the second bridge output terminal for receiving the first bridge signal and the second bridge signal, wherein the normalized balanced detection module calculates the first bridge signal and the second bridge signal for generating and outputting an error signal; and a control module communicating with the normalized balanced detection module for receiving the error signal, wherein the control module generates a controlling voltage signal according to the error signal, and sends the controlling voltage to the second laser device for tuning a frequency of the second laser; the control module also sends the controlling voltage to the microwave phase shifter for adjusting the phase shift;

wherein the normalized balanced detection module comprises a first microwave diode, a second microwave diode and a processor, wherein the first microwave diode communicates with the first bridge output terminal for receiving the first bridge signal and generates a C1 signal; the second microwave diode communicates with the second bridge output terminal for receiving the second bridge signal and generates a C2 signal; the processor respectively communicates with the first microwave diode and the second microwave diode, so as to process the C1 signal and the C2 signal with: (C1−C2)/(C1+C2).

2. An optic-microwave frequency discriminator for laser frequency difference locking, comprising:

a fiber coupler, wherein the fiber coupler receives and combines a first laser from a first laser device and a second laser from a second laser device, the fiber coupler respectively generates and outputs a first light signal and a second light signal, which are identical, through a first fiber coupler output terminal and a second fiber coupler output terminal;

a photodiode module respectively communicating with the first fiber coupler output terminal and the second fiber coupler output terminal, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal;

a microwave phase shifter communicating with the second photodiode output terminal, so as to receive the second microwave signal, generate a shifted microwave signal by introducing a phase shift to the second microwave signal, and output the shifted microwave signal;

a 90° microwave bridge comprising a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; the 90° microwave bridge combines the first microwave signal and the shifted microwave signal for generating a first bridge signal which is outputted through the first bridge output terminal, and generating a second bridge signal which is outputted through the second bridge output terminal;

a normalized balanced detection module, which respectively communicates with the first bridge output terminal and the second bridge output terminal for receiving the first bridge signal and the second bridge signal, wherein the normalized balanced detection module calculates the first bridge signal and the second bridge signal for generating and outputting an error signal; and a control module communicating with the normalized balanced detection module for receiving the error signal, wherein the control module generates a controlling voltage signal according to the error signal, and sends the controlling voltage to the second laser device for tuning a frequency of the second laser; the control module also sends the controlling voltage to the microwave phase shifter for adjusting the phase shift;

wherein the photodiode module comprises:

a first photodiode communicating with the first fiber coupler output terminal, so as to receive the first light signal, convert the first light signal into the first microwave signal, and output the first microwave signal through the first photodiode output terminal; and a second photodiode communicating with the second fiber coupler output terminal, so as to receive the second light signal, convert the second light signal into the second microwave signal, and output the second microwave signal through the second photodiode output terminal;

wherein after being converted by the photodiode module, frequencies of the first microwave signal and the second microwave signal equal to a frequency difference between the first laser and the second laser;

wherein a phase difference between the first bridge signal and the second bridge signal meets:

$$\Phi(V) := 2 \cdot \pi \cdot \frac{OPD}{c} \cdot fB + \theta(V)$$

wherein $\theta(V)$ is the phase shift introduced by the microwave phase shifter, OPD is an optical path difference between the first light signal and the second light signal, fB is the frequency difference between the first laser and the second laser, and c is a light speed in a fiber;

wherein the normalized balanced detection module generates the error signal according to:

$$U(V, fB) := \cos\left[\left(2 \cdot \pi \cdot \frac{OPD}{c} \cdot fB\right) + \theta(V)\right];$$

wherein the normalized balanced detection module comprises a first microwave diode, a second microwave diode and a processor, wherein the first microwave diode communicates with the first bridge output terminal for receiving the first bridge signal and generates a C1 signal; the second microwave diode communicates with the second bridge output terminal for receiving the second bridge signal and generates a C2 signal; the processor respectively communicates with the first microwave diode and the second microwave diode, so as to process the C1 signal and the C2 signal with: (C1−C2)/(C1+C2).

3. A method of an optic-microwave frequency discriminator for laser frequency difference locking, comprising steps of:

receiving and combining a first laser from a first laser device and a second laser from a second laser device with a fiber coupler, then respectively generating and outputting a first light signal and a second light signal, which are identical, through a first fiber coupler output terminal and a second fiber coupler output terminal;

respectively communicating with the first fiber coupler output terminal and the second fiber coupler output terminal with a photodiode module, so as to receive the first light signal and the second light signal, wherein the photodiode module converts the first light signal into a first microwave signal and converts the second light signal into a second microwave signal; wherein the photodiode module comprises a first photodiode output terminal and a second photodiode output terminal, the first microwave signal and the second microwave signal are respectively outputted through the first photodiode output terminal and the second photodiode output terminal;

communicating with the second photodiode output terminal with a microwave phase shifter, so as to receive the second microwave signal, generate a shifted microwave signal by introducing a phase shift to the second microwave signal, and output the shifted microwave signal;

using a 90° microwave bridge comprising a first bridge input terminal, a second bridge input terminal, a first bridge output terminal and a second bridge output terminal, wherein the first bridge input terminal communicates with the first photodiode output terminal for receiving the first microwave signal, the second bridge input terminal communicates with the microwave phase shifter for receiving the shifted microwave signal; combining the first microwave signal and the shifted microwave signal with the 90° microwave bridge for generating a first bridge signal which is outputted through the first bridge output terminal, and generating a second bridge signal which is outputted through the second bridge output terminal;

respectively communicating with the first bridge output terminal and the second bridge output terminal with a normalized balanced detection module for receiving the first bridge signal and the second bridge signal, wherein the normalized balanced detection module calculates the first bridge signal and the second bridge signal for generating and outputting an error signal; and communicating with the normalized balanced detection module with a control module for receiving the error signal, wherein the control module generates a controlling voltage signal according to the error signal, and sends the controlling voltage to the second laser device for tuning a frequency of the second laser; the control module also sends the controlling voltage to the microwave phase shifter for adjusting the phase shift;

wherein after being converted by the photodiode module, frequencies of the first microwave signal and the second microwave signal equal to a frequency difference between the first laser and the second laser;

wherein a phase difference between the first bridge signal and the second bridge signal meets:

$$\Phi(V) := 2 \cdot \pi \cdot \frac{OPD}{c} \cdot fB + \theta(V)$$

wherein θ(V) is the phase shift introduced by the microwave phase shifter, OPD is an optical path difference between the first light signal and the second light signal, fB is the frequency difference between the first laser and the second laser, and c is a light speed in a fiber;

wherein the normalized balanced detection module generates the error signal according to:

$$U(V, fB) := \cos\left[\left(2 \cdot \pi \cdot \frac{OPD}{c} \cdot fB\right) + \theta(V)\right];$$

wherein the normalized balanced detection module comprises a first microwave diode, a second microwave diode and a processor, wherein the first microwave diode communicates with the first bridge output terminal for receiving the first bridge signal and generates a C1 signal; the second microwave diode communicates with the second bridge output terminal for receiving the second bridge signal and generates a C2 signal; the processor respectively communicates with the first microwave diode and the second microwave diode, so as to process the C1 signal and the C2 signal with: (C1−C2)/(C1+C2).

* * * * *